United States Patent [19]
Kato et al.

[11] Patent Number: 5,684,595
[45] Date of Patent: Nov. 4, 1997

[54] ALIGNMENT APPARATUS AND EXPOSURE APPARATUS EQUIPPED THEREWITH

[75] Inventors: Masaki Kato, Tokyo; Hideo Mizutani; Masashi Tanaka, both of Kanagawa, all of Japan

[73] Assignee: Nikon Corporation, Tokyo, Japan

[21] Appl. No.: 720,212

[22] Filed: Sep. 26, 1996

Related U.S. Application Data

[63] Continuation of Ser. No. 396,885, Mar. 1, 1995, abandoned, which is a continuation of Ser. No. 220,941, Mar. 31, 1994, abandoned, which is a continuation of Ser. No. 67,391, May 25, 1993, abandoned, which is a continuation of Ser. No. 811,543, Dec. 20, 1991, abandoned.

[30] Foreign Application Priority Data

Dec. 25, 1990 [JP] Japan ............................ 2-414522

[51] Int. Cl.$^6$ ...................................... G01B 11/00
[52] U.S. Cl. ........................................ 356/401
[58] Field of Search ........................... 356/399–401; 355/43, 53; 250/548, 559.3

[56] References Cited

U.S. PATENT DOCUMENTS 4,435,041  3/1984  Torok et al. .
4,629,313  12/1986  Tanimoto ........................ 356/401
4,888,614  12/1989  Suzuki ............................ 355/43
5,094,539  3/1992  Komoriya et al. ............. 356/401
5,161,057  11/1992  Johnson ......................... 359/566

FOREIGN PATENT DOCUMENTS 1227431  9/1989  Japan .

*Primary Examiner*—K. Hantis
*Attorney, Agent, or Firm*—Michael N. Meller

[57] ABSTRACT

An alignment apparatus for aligning a first object (reticle) with a second object (wafer) when irradiating a projection light on the first object to project a pattern of the first object onto the second object through a projection optical system. The apparatus includes an illumination optical system for illuminating a plurality marks on the second object with an alignment light having a wavelength band different from the projection light, a detection optical system for receiving the alignment light from the illuminated mark through the projection optical system to detect an image of the mark formed by the alignment light, and a compensating optical system arranged within the detection optical system for compensating a chromatic aberration of magnification caused by the projection optical system due to the differences among the wavelengths within the wavelength band of the alignment light.

32 Claims, 11 Drawing Sheets

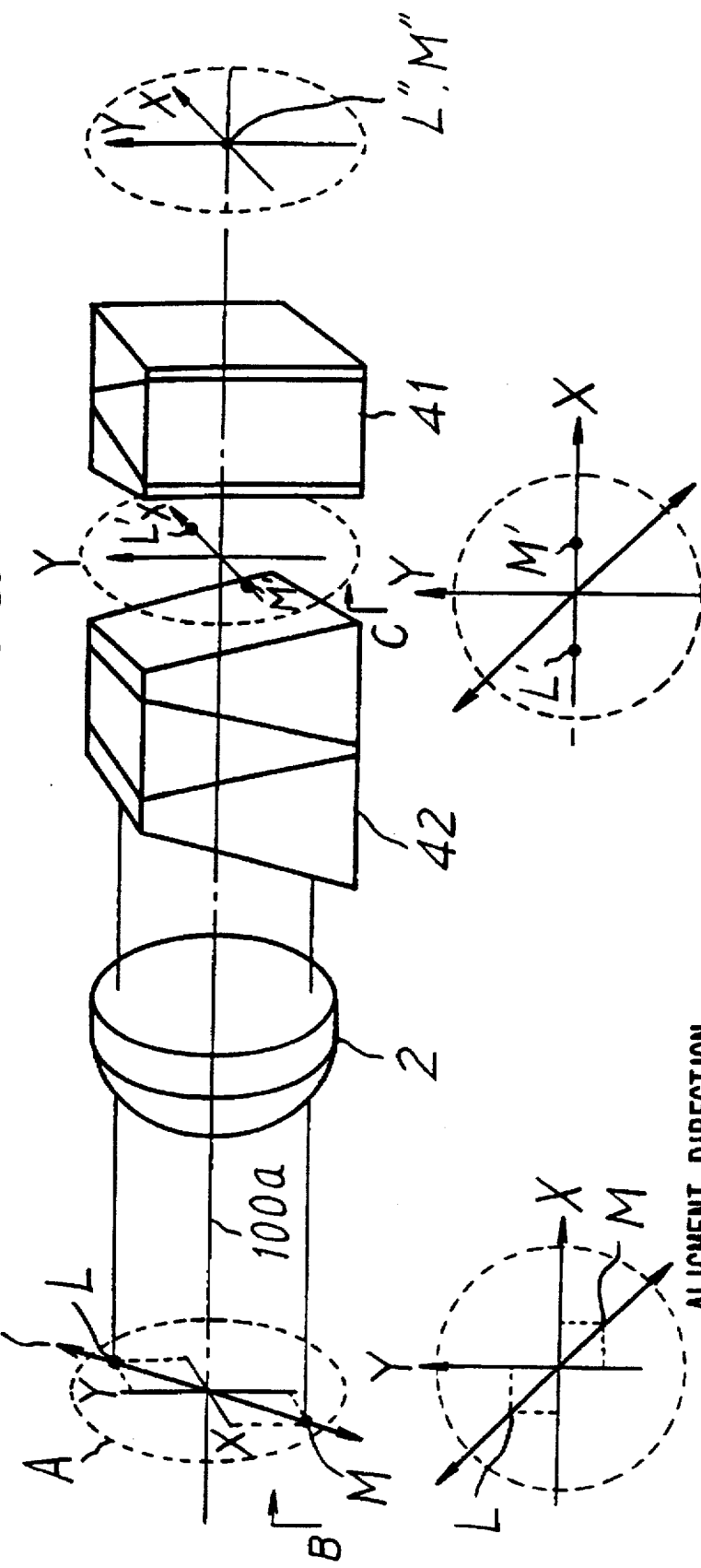

ALIGNMENT APPARATUS AND EXPOSURE APPARATUS EQUIPPED THEREWITH

This application is a continuation, of application Ser. No. 08/396,885, filed Mar. 1, 1995, which is a continuation of Ser. No. 08/220,941 filed Mar. 31, 1994, which is a continuation of Ser. No. 08/067,391 filed May 25, 1993, which is a continuation of 08/811,543 filed Dec. 30, 1991, all now abandoned.

BACKGROUND OF THE INVENTION

1. Field of the Invention

The present invention relates to an alignment apparatus of a projection exposure apparatus used for example for the manufacture of semiconductor devices, and more particularly to an alignment apparatus used with a stepper for successively exposing the patterns on photomasks (hereinafter referred to reticles) to be projected on the photoresist layer of a wafer by the step and repeat method.

2. Description of the Prior Art

In accordance with conventional projection exposure apparatus for the manufacture of semiconductors, the circuit pattern formed on a reticle (first object) is projected onto the photoresist layer of a wafer (second object) so as to transfer or print the circuit pattern in the photoresist. In this case, prior to the projection exposure, it is necessary to detect the alignment mark on the wafer and thereby to effect a relative positioning or alignment between the reticle and the wafer.

In order to effect the alignment with a high degree of accuracy, there are known alignment methods including a through-the-lense (TTL) system in which the alignment marks are detected through the projection optical system of an exposure apparatus and a through-the-reticle (TTR) system in which the alignment marks are detected through the reticle. In this case, the projection optical system of the exposure apparatus is satisfactorily aberration compensated only with respect to the wavelength of the exposure light so that if the alignment light is different in wavelength from the exposure light, various aberrations are caused by the projection optical system.

However, where the alignment light has the same wavelength as the exposure light, there is a problem that the photoresist layer applied onto the wafer is sensitized by absorbing the alignment light and moreover the reflected light from the alignment mark is decreased, thereby deteriorating the S/N ratio during the detection of the alignment mark.

Thus, there have been proposed alignment apparatus of this type employing an alignment light having a wavelength different from that of an exposure light so that the chromatic aberration in the optical axis direction (the longitudinal chromatic aberration) is compensated for as in the case of an apparatus disclosed in Japanese Laid-Open Patent Publication No. 1-227431 or an optical system is provided to correct the astigmatism and coma of an alignment light composed of a monochromatic light.

However, the conventional alignment apparatus have problems which will be described hereunder.

In the past, it has been the general practice to use a monochromatic light as the alignment light for detecting through the projection optical system an image of the alignment mark located off the axis. In this case, however, there is the disadvantage of the reflected light from the photoresist and the reflected light from the wafer surface interferring with each other.

In other words, since the shape of the deposited resist on the step-shaped alignment mark becomes asymmetric unavoidably, the resulting interference pattern becomes asymmetric correspondingly and the detection signal resulting from the interference pattern becomes asymmetric and complicated, thereby making the detection of the alignment mark impossible or increasing the detection error.

On the other hand, where the alignment light has a certain wavelength bandwidth in order to reduce the susceptibility to the effect of the interference, a considerable amount of chromatic aberrations is caused by the projection optical system (projection lens) due to the wavelength differences within the wavelength band of the alignment light thus causing the resulting image of the alignment mark to blur.

In particular, while it is important from the standpoint of enhancing the alignment accuracy in the meridional direction (the direction which crosses the plane containing the optical axis of the projection lens on the wafer) to arrange the alignment mark on the wafer in the sagittal direction (the direction which meets at right angles the direction crossing the plane containing the optical axis of the projection lens on the wafer), the presence of a chromatic aberration of magnification causes a considerable difficulty for the position detection in the meridional direction.

The problem of the chromatic aberration of magnification within the wavelength band of the alignment light will now be described with reference to FIGS. 14a and 14b and FIG. 15.

When the meridional direction of the alignment mark located off the axis is observed through the projection optical system with the alignment light having a certrain wavelength band, a lateral shift of the resulting image of the alignment mark is caused at each of the respective wavelengths as shown in FIG. 14a. In FIG. 14a, the solid line indicates a detection signal of the image of the alignment mark at the reference wavelength (center wave-length) $\lambda_0$ of the alignment light, the broken line indicates a detection signal of the image of the alignment mark at the minimum wavelength $\lambda_1$ within the wavelength band of the alignment light, and the dot-and-dash line indicates a detection signal of the image of the alignment mark at the maximum wavelength $\lambda_2$.

Actually, the alignment mark is detected as a composite image of the images at the respective wavelengths so that if the reflected beams from the alignment mark at the respective wavelengths are substantially the same in intensity, a symmetrical detection signal is produced as shown in FIG. 14b.

Where the alignment mark is covered with a thin film, e.g., the photoresist, however, there is the possibility of the intensity of the reflected light being varied due to a slight coating variation. FIG. 15 shows the relation between the resist thickness and the intensity of the reflected beams at the respective wavelengths. The intensity of the reflected beam varies at a period which is dependent on the wavelength, that is, the period is decreased with decrease in the wavelength and the period is increased with increase in the wavelength, so that only a slight change in the film thickness causes the reflected beam intensities at the respective wavelengths to differ considerably from one another.

For instance, when the thickness of the resist is $t_1$ in FIG. 15, the resulting reflected beam intensity I becomes $I(\lambda_2) > I(\lambda_0) > I(\lambda_1)$ so that the image intensity at the maximum wavelength $\lambda_2$ in the alignment wavelength band is increased and the image intensity at the minimum wavelength $\lambda_1$ in the alignment wavelength band is decreased as shown in FIG.

14c. As a result, the alignment mark is observed as an image with an asymmetric resultant intensity as shown in FIG. 14d and the center of the image intensity is then shifted by Δx as compared with the case of FIG. 14b.

In other words, where the alignment light has a certain range of wavelengths in order to reduce the effect of the interference of the light beams, a new problem of chromatic aberration of magnification arises and the shape of a resultant image of the images at the respective wavelengths is caused to change due to a slight variation in the resist layer thickness, thus causing an error in the detection of the position of the alignment mark.

SUMMARY OF THE INVENTION

The present invention has been made in view of these circumstances and it is an object of the invention to provide an alignment apparatus so designed that when aligning a first object with a second object by detecting the image of an alignment mark on the second object through a projection lens (projection optical system) having a chromatic aberration of magnification, even if the alignment mark is covered by a thin film, the alignment can be effected with a high degree of accuracy without suffering the effect due to the interference of the thin film, and an exposure apparatus equipped with such alignment apparatus.

To accomplish the above object, in accordance with a first aspect of the present invention there is provided an alignment apparatus for aligning a first object and a second object relative to each other when irradiating a projection light onto the first object to project the pattern on the first object onto the second object through a projection optical system. The apparatus includes an illumination optical system for illuminating the mark on the second object with an alignment light having a wavelength band which is different from that of the projection light, a detection optical system for receiving the alignment light from the mark through the projection optical system to detect the mark image, and a compensating optical system arranged within the detection optical system to compensate a chromatic aberration of magnification caused by the projection optical system in response to the wavelength differences within the wavelength band of the alignment light.

In accordance with another aspect of the present invention there is provided an exposure apparatus including exposure light supply means for supplying an exposure light to a first body, a projection optical system for projecting the pattern formed on the first object onto a second object under the application of the exposure light, and an alignment system for aligning the first and second object relative to each other.

The alignment system includes an illumination optical system for illuminating the alignment mark on the second object with the alignment light including light of a plurality of wavelengths different from that of the projection light, a detection optical system for receiving the alignment light from the alignment mark through the projection optical system to detect an image of the alignment mark produced by the alignment light, and a compensating optical system for compensating a chromatic aberration of magnification produced by the projection optical system in response to the differences in wavelength among the light of the different wavelengths within the alignment light.

In accordance with the present invention, by virtue of the fact that the alignment light has a range of wavelengths and that the alignment optical system includes the compensating optical system for compensating the chromatic aberration of magnification caused by the projection optical system, even if the alignment mark is covered with the thin film, it is possible to detect an extremely sharp image of the alignment mark and thereby to effect a highly accurate alignment mark without being subjected to the effect due to the interference of the light beams.

By using the alignment apparatus of the present invention in an exposure apparatus for manufacturing semi-conductor devices, it is possible to avoid any deterioration of the detection accuracy due to variation in the coating of the photoresist and enhance the accuracy of a wafer-to-reticle alignment.

The above and other objects, features and effects of the present invention will become more apparent from the following detailed description taken in conjunction with the accompanying drawings.

BRIEF DESCRIPTION OF THE DRAWINGS

FIG. 10 is a plan view showing the manner in which the chromatic aberration of magnification varying in response to the movement of the alignment system is compensated for.

FIGS. 13a, 13b and 13c show the manner in which the chromatic aberration of magnification is compensated for by two direct vision prisms.

DESCRIPTION OF THE PREFERRED EMBODIMENTS

Figure 1:
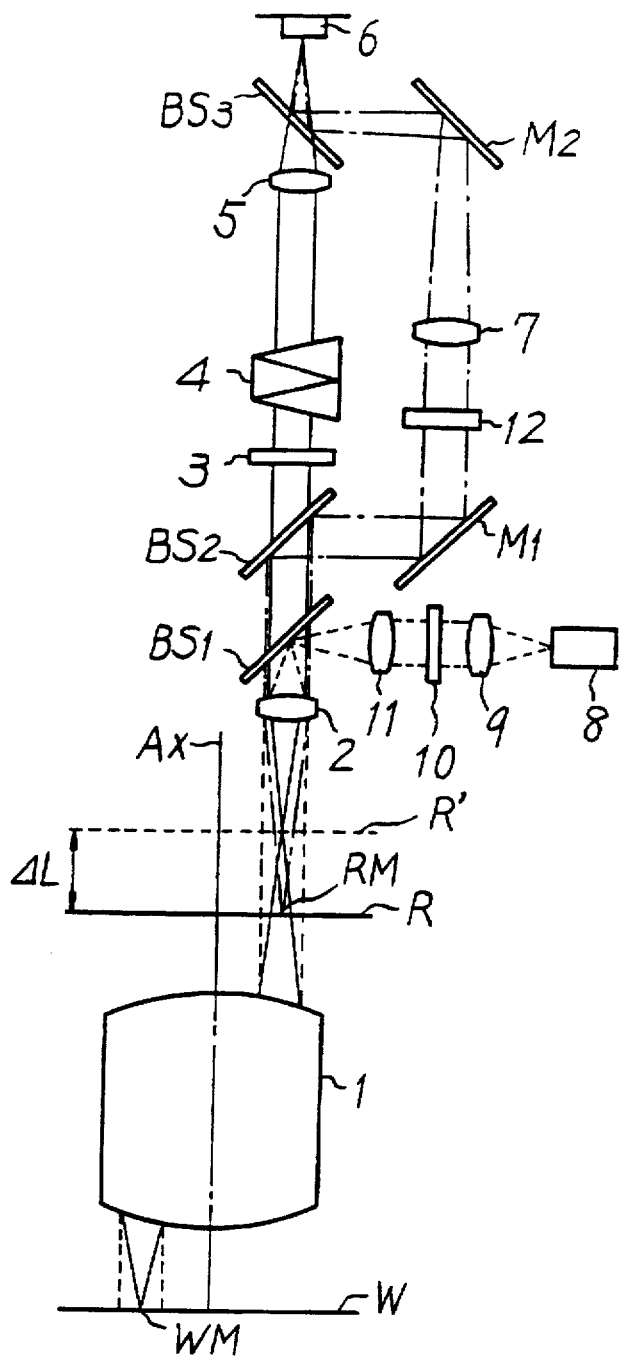
FIG. 1 is a schematic diagram showing the manner in which an alignment apparatus according to a first embodiment of the present invention is incorporated in the TTR alignment system of a projection exposure apparatus.

Where the area observed by an alignment optical system is narrow, the chromatic aberration of magnification caused by a projection optical system can be considered to be of substantially the same amount all over the observation field of view. Also, in a proper range of wavelengths (e.g., an exposure light wavelength $\lambda_e=365$ nm and an alignment light wavelength of 633±50 nm), the amount of chromatic aberration of magnification caused by the projection optical system is substantially in a proportional relation with the wavelength, and the amount of chromatic aberration of magnification within the wavelength band of the alignment light is substantially equal to the amount of dispersion by a prism, grating (diffraction grating) or the like. Therefore, in accordance with the present invention, a dispersion member such as a prism or grating (diffraction grating) is arranged in the alignment optical system to compensate for the lateral shift of an image. Thus, in order to facilitate the understanding of the present invention, the principle of the present invention will be described first prior to describing the respective embodiments of the present invention.

The compensation of chromatic aberration of magnification according to the present invention will be explained with reference to FIG. 11.

In the Figure, designated at f are the focal distances of an objective lens 2 of an alignment system which is arranged on the side of a projection optical system (the image plane of the projection optical system=A), and $\Delta y$ (the amount of chromatic aberration of magnification indicated as $\Delta y_1$ or $\Delta y_2$ in the Figure) caused by the light beam of the minimum wavelength (the light beam indicated by the lower broken lines) or the light beam of the maximum wavelength (the light beam indicated by the upper dot-to-dash lines) in the wavelength band of the alignment light and the light beam of the reference wavelength in the wavelength band (the light beam indicated by the solid lines). Then, assuming that $\theta$ represents the value representing the amount of chromatic aberration of magnification $\Delta y$ in terms of the angle of the chief ray, the relation of equation (1) holds $$\sin \theta = \Delta y / f \quad (1)$$

Therefore, if a chromatic aberration of magnification compensating optical system 4 (represented by a single wedge prism in the Figure) has an angle of dispersion $\delta$ (the angle formed by the chief ray of the minimum or maximum wavelength within the wavelength band of the alignment light and the chief ray of the reference wavelength within the same wave-length band at the time of their incidence on the chromatic aberration of magnification compensating optical system 4), it is possible to construct so that when this angle of dispersion is multiplied by 2, the resulting 2×$\delta$ becomes equal to 2×$\theta$ in equation (1) and the chromatic aberration of magnification of the projection objective lens is compensated for. Thus, equation (1) can be represented in the form of the following equation (2)

$$\sin \delta = \Delta y / f \quad (2)$$

The relation of equation (2) generally holds if an objective lens and an imaging lens form substantially a parallel system as in the case of the alignment optical system of an embodiment which will be described later.

The relations of the above-mentioned equations (1) and (2) hold not only in the case where the chromatic aberration of magnification compensating optical system is composed of a single wedge prism as well as in cases where it is composed of a combination of a plurality of wedge prisms or where it employs a grating (diffraction grating).

For purposes of simplifying the description, consider a case in which a composite wedge prism produced by cementing a plurality of wedge prisms is considered as a single wedge prism, with $\alpha$ representing the vertical angle of this wedge prism, $n_1$ the refractive index of the wedge prism for the light beam of a wavelength $\lambda_1$ which is the minimum wavelength within the wavelength band of the alignment light, $\beta_1$ the angle of deviation for the light beam of the wavelength$\lambda_1$, $n_2$ the refraction index of the wedge prism for the light beam of a wavelength$\lambda_2$ which is the maximum wavelength within the wavelength band of the alignment light, and $\beta_2$ the angle of deviation for the light beam of the wavelength$\lambda_2$, and in this case the following relation holds With respect to $\lambda_1$ $$\beta_1 = (n_1 - 1)\alpha$$

With respect to $\lambda_2$ $$\beta_2 = (n_2 - 1)\alpha$$

From these equations, we obtain $$\beta_1 - \beta_2 = (n_1 - 1)\alpha - (n_2 - 1)\alpha = (n_1 - n_2)\alpha$$

Figure 12:
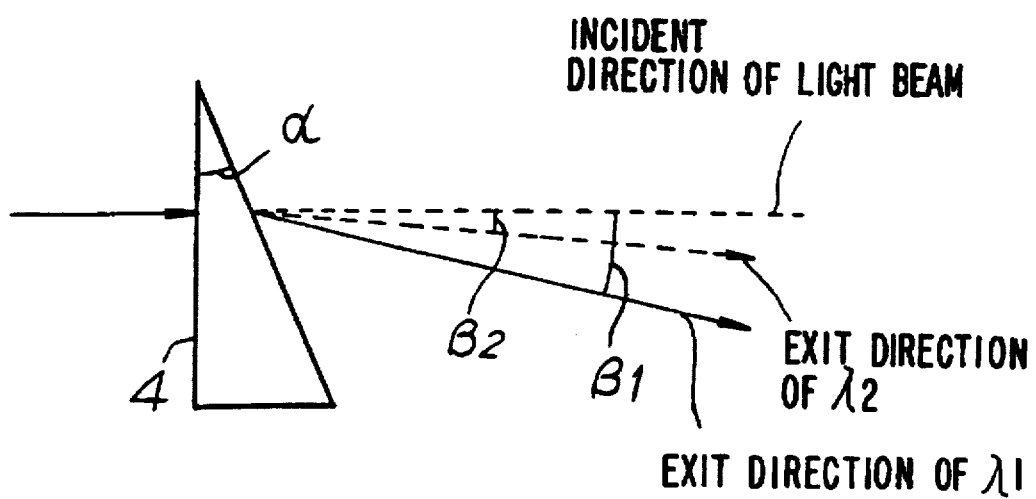
FIG. 12 shows the manner in which the angle of deviation of the transmitted light differs depending on the wavelength when a multi-wavelength light is passed through the single wedge prism.
Figure 14A:
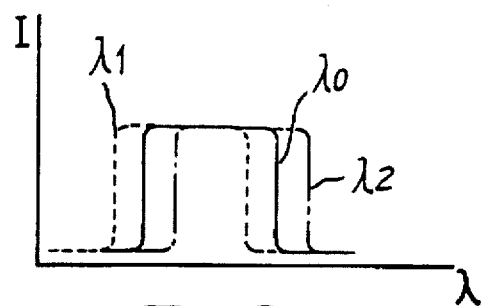
FIGS. 14a, 14b, 14c and 14d are graphs for explaining the concept of a detection error due to lateral shifts of the wafer mark image.
Figure 14B:
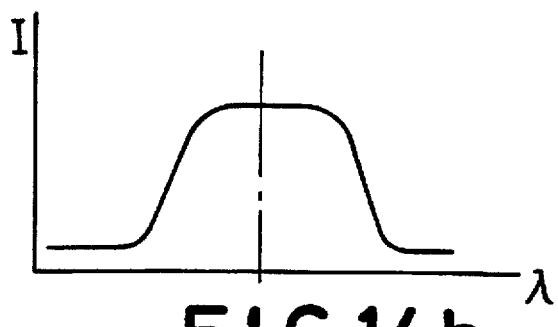
Figure 14C:
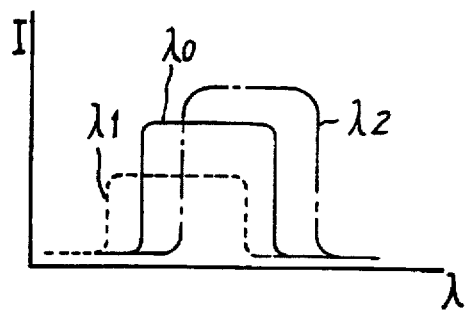
Figure 14D:
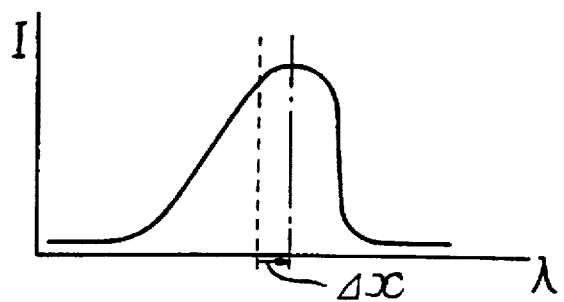
Figure 15:
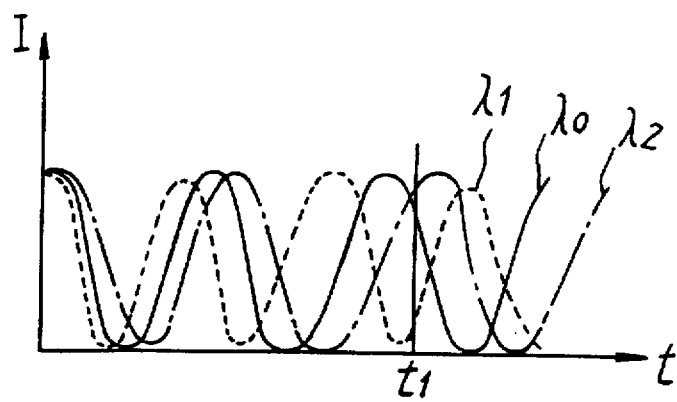
FIG. 15 is a graph showing the relation between the resist film thickness and the reflected light intensity with respect to the respective wavelengths.

It is to be noted that the angle of deviation means the angle formed by the direction of the incident light beam entering the wedge prism and the direction of the exit light beam emerging from the wedge prism as shown in FIG. 12.

Figure 11:
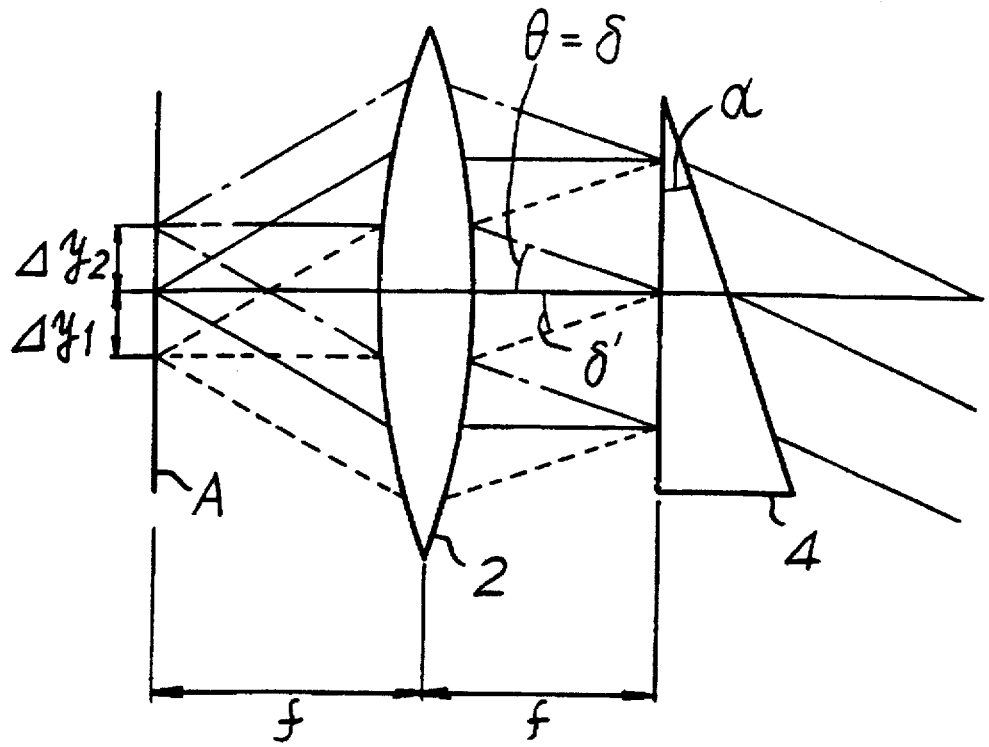
FIG. 11 shows the manner in which the chromatic aberration of magnification is compensated for by a single wedge prism.

Therefore, in FIG. 11 $\delta'$ (the half angle of the angle formed by the chief ray of the minimum wavelength and the chief ray of the maximum wavelength within the wavelength band of the alignment light) becomes as $\beta_1 - \beta_2 = 2 \cdot \delta'$ so that if $n_1 - n_2 = \Delta n$, then the following equation (3) is derived $$\delta' = \Delta n \cdot \alpha \cdot \frac{1}{2} \quad (3)$$

The chromatic aberration of magnification can be compensated for by arranging a prism satisfying this equation (3) in the alignment optical system.

Then, while the amount and direction of a transverse shift of the image of the alignment mark due to the chromatic aberration of magnification varies depending on the position of the alignment mark within the meridional plane of the projection optical system, in accordance with the present invention a plurality of chromatic aberration of magnification compensating optical systems having different compensating directions may be provided so as to be moved (rotated) relative to one another, thereby adjusting the direction of compensation and amount of compensation of the chromatic aberration of magnification.

This point will be explained with reference to FIGS. 13a, 13b and 13c. FIGS. 13a, 13b and 13c show an exemplary case employing a pair of composite wedge prisms each composed of three wedge prisms whose refractive indices are relatively low, high and low, respectively, and which are cemented in a manner that their verticle angles are arranged alternately (the so-called direct vision prisms. By cementing the prisms whose refractive indices are relatively low, high and low, respectively, in this way, it is possible to cause the optical axis for the reference wavelength to extend straight forward), and the direct vision prisms 41 and 42 are arranged in such a manner that the refraction directions of light beam cross each other at right angles.

For purposes of discussion, let us consider rectangular coordinates whose origin is a point on the optical axis as shown in FIGS. 13a to 13c (FIGS. 13b and 13c are diagrams showing the coordinate system assumed in FIG. 13a as looked from the directions of arrows B and C, respectively) and assume that an image of an alignment mark by light of a wavelengths $\lambda_1$ is focused at a point L and an image of the alignment mark by light of a wavelength $\lambda_2$ is focused at a point M due to the chromatic aberration of magnification of a projection optical system (designated at A is the imaging plane of the projection optical system).

When the alignment light is projected onto the first direct vision prism 42 through an objective lens 2, the shifts of the images in the y-direction are compensated for in the prism 42 so that the images are respectively arranged at positions L' and M on an x-axis. Then, the alignment light enters the second direct vision prism 42 where the shifts in the x-direction are compensated for so that the images L" and M" respectively formed by the light of the wavelengths $\lambda_1$ and $\lambda_2$ are brought into coincidence on the optical axis.

While, in FIG. 13a, the direct vision prisms 41 and 42 are arranged so that their compensating directions cross each other at right angles, the direct vision prisms 41 and 42 can be rotated relatively to vary the amount of compensation in the x-direction and the amount of compensation in the y-direction and in this way the direction of compensation and the amount of compensation can be adjusted arbitrarily.

Where the compensating optical system is composed of a grating, a plurality of gratings can be moved relatively so as to similarly control the directions of compensation and the amounts of compensation. Also, the adjustment of the amounts of compensation and the directions of compensation to some extent can be effected by moving the single chromatic aberration of magnification compensating optical system in the optical axis direction or within the plane perpendicular to the optical axis.

The embodiments of the present invention will now be described in detail.

FIG. 1 shows a construction in which an alignment apparatus according to the first embodiment of the present invention is incorporated in a projection exposure apparatus.

The exposure light from an exposure optical system which is not shown illuminates uniformly a reticle R containing a circuit pattern formed thereon so that an image of the circuit pattern on the reticle is projected and transferred onto a wafer W through a projection objective lens 1 (herein-after referred to as a projection lens). In other words, the reticle R and the wafer W are arranged to be conjugate with respect to the projection lens 1.

On the other hand, an alignment optical system for relatively aligning the reticle R with the wafer W is arranged above the reticle R and in this embodiment the alignment employs the so-called TTR method which simultaneously detects a reticle mark RM and a wafer mark WM.

The light beam having a certain wavelength band and emitted from a light source 8 (e.g., a white light source or a multi-waveform laser) is first converted to a collimated light beam by a collimator lens 9 and then the wavelength band is reduced by a filter 10 which passes only those light beams within a given wavelength band. In other words, the wavelength band is reduced to a given range of wavelengths which is used as the alignment light and different from the exposure light.

Thereafter, the alignment light of the reduced band is converted to a collimated light beam through a condensing lens 11 and an objective lens 2 so that one of the alignment light beams illuminates the reticle mark RM on the reticle R and also the other alignment light beam illuminates the wafer mark WM on the wafer W through the reticle R and the projection lens 1.

In this case, the light source 8, the collimator lens 9, the filter 10, the condensing lens 11 and the objective lens 2 form an alignment illumination optical system (hereinafter referred to as an illumination optical system) as illumination means.

Then, the detection optical system of the alignment optical system is composed of a bifocus system designed to split the reflected light from each of the reticle mark RM and the wafer mark WM by a beam splitter and an image of the reticle mark RM and an image of the wafer mark WM are formed on the same detector.

Firstly, the reflected light from the wafer mark WM illuminated by the illumination optical system (the reference wavelength light is indicated by the solid line in the Figure) is imaged through the projection lens 1 and the reticle R at a position apart by ΔL upwardly from the reticle R or a position shifted by an amount corresponding to the longitudinal chromatic aberration of the projection lens 1 and then passed through two beam splitters $BS_1$ and $BS_2$. Thus, the astigmatism is compensated for by a cylinder lens 3 having a condensing function in a direction perpendicular to the plane of the paper and the chromatic aberration of magnification is compensated for by the chromatic aberration of magnification compensating optical system 4.

Thereafter, the light passed through the chromatic aberration of magnification compensating optical system 4 is condensed by an imaging lens 5 and a sharp image of the wafer mark WM is formed through a beam splitter $BC_3$ on detecting means 6 (e.g., a CCD detecting means or a television camera which is hereinafter referred to as a detector).

On the other hand, the reflected light from the reticle mark RM illuminated by the illumination optical system (the light is indicated by the dot-and-dash line in FIG. 1) is condensed by the objective lens 2, passed through the beam splitter $BS_1$ and then reflected by the beam splitter $BS_2$. Thus, the reflected light from the beam splitter $BS_2$ is first reflected by a reflecting mirror $M_1$ and then it is passed through a filter 12 which transmits only the light of a single predetermined wavelength.

Thereafter, the light from the filter 12 is condensed by an imaging lens 7 and an image of the reticle mark RM is formed on the detecting means through a reflecting mirror $M_2$ and the beam splitter $BS_3$.

In this case, since the reticle mark RM is not coated with the resist as in the case of the wafer mark WM, its image is not subjected to the effect of the thin film interence due to the resist. Also, it is necessary to eliminate the load on the objective lens 2 for the chromatic aberration compensation of the reflected light from the reticle mark RM. For this reaseon, the image of the reticle mark RM is detected with the monochromatic light by the filter 12.

By virtue of the above-described construction, the detector 6 can simultaneously detects the images of the respective marks so that in accordance with the resulting detection signals an alignment of the reticle R and the wafer W relative to each other is accomplished.

Note that it is possible to provide a transmission window adjacent to the reticle mark RM on the reticle R so as to take out the reflected light from the wafer mark WR through the transmission window and to replace the beam splitters BS₂ and BS₃ with a partial reflecting member, etc., for transmitting only the reflected light from the wafer mark WM and reflecting the light beam from the reticle mark and an indecia plate having two reference marks and provided on the photosensitive surface of the detector 6 so as to obtain the amounts of shift of the respective mark images.

Also, with this construction, it is possible to arrange so that the reflecting mirror M₂ and the partial reflecting member arranged between the imaging lens 5 and the detector 6 are eliminated, that a second detector is arranged at the imaging position of the imaging lens 7 and that an indicia plate having a reference mark is arranged on the photosensitive surface of each detector whereby the shifts of the mark images with respect to the reference marks at the indecia positions are separately detected by the two detecting means.

Then, while, in the present embodiment, the reflected light from the wafer mark WM is passed through the projection lens 1 so that an image of the wafer mark WM is formed at a conjugate plane R' above the reticle R, this image is considerably blurred due to the chromatic aberrations (the longitudinal chromatic aberration and the chromatic aberration of magnification) of the projection lens 1.

Referring now to a case where the amount of shift between the optical axis of the projection lens 1 and the optical axis of the alignment optical system is represented by an image height Y of the projection lens, the resulting chromatic aberrations will be described in detail.

Figure 5:
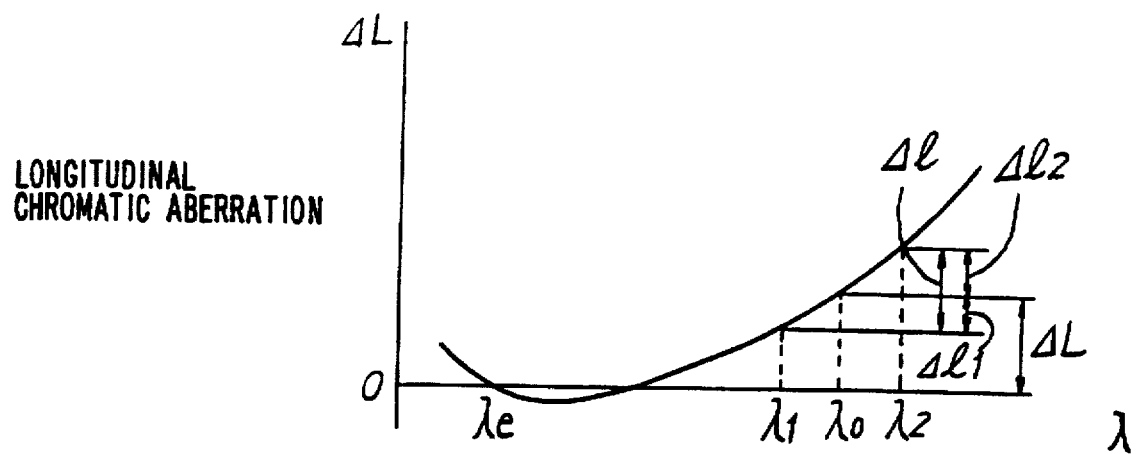
FIG. 5 is a graph showing the relation between the wavelength λ and the longitudinal chromatic aberration ΔL.
Figure 6:
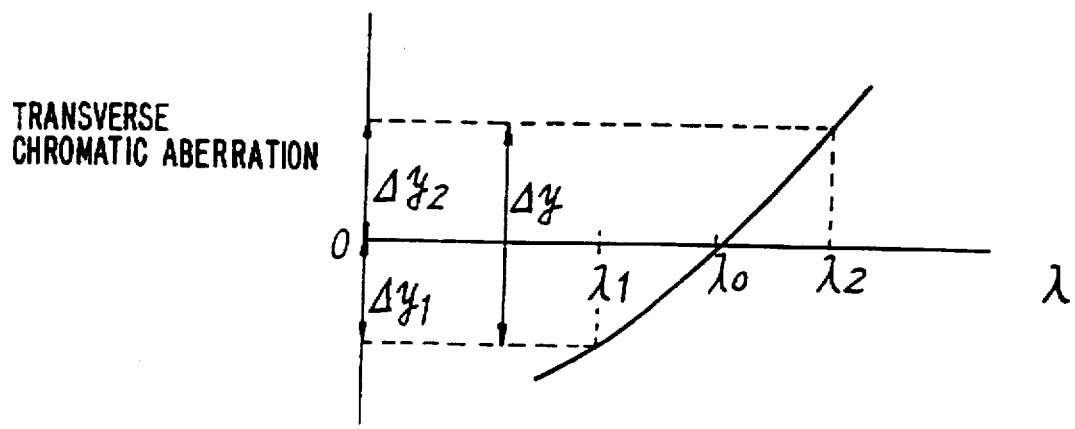
FIG. 6 is a graph showing the relation between the wavelength λ and the lateral or transverse chromatic aberration.

FIG. 5 shows the longitudinal chromatic aberrations when an exposure light wavelength$\lambda_e$ is used as a reference, and FIG. 6 shows the transverse chromatic aberrations (chromatic aberrations of magnification) when the center wavelength of the wavelength band $\lambda_1$ to $\lambda_2$ of the alignment light.

In FIG. 5, the projection lens 1 is subjected to aberration compensation only with respect to the exposure light wavelength$\lambda_e$ and therefore the imaging position of the alignment light of a reference wavelength $\lambda_0$ is shifted by $\Delta L$ in the optical axis direction with respect to the imaging position of the exposure light wavelength $\lambda_e$. In other words, when considered with reference to FIG. 1, the conjugate plane R' of the wafer W due to the reference wavelength light of the alignment light does not coincide with the reticle R and it is shifted upwardly by $\Delta L$ from the reticle R.

Referring again to FIG. 5, the imaging position by the maximum wavelength$\lambda_2$ within the wavelength band of the alignment light is shifted upwardly by $\Delta l_2$ with respect to the imaging position by the reference wavelength$\lambda_0$ and the imaging position by the minimum wavelength$\lambda_1$ is shifted downward by $\Delta l_1$ with respect to the imaging position by the reference wavelength$\lambda_0$.

Also, in FIG. 6, the imaging position by the maximum wavelength$\lambda_2$ is shifted by $\Delta y_2$ in a plane perpendicular to the optical axis with respect to the imaging position by the reference wavelength$\lambda_0$ of the alignment light, and the imaging position by the minimum wavelength$\lambda_1$, is shifted by $\Delta y_1$ with respect to the imaging position by the reference position$\lambda_0$ in the opposite direction to the case of the maximum wavelength$\lambda_2$.

Figure 2:
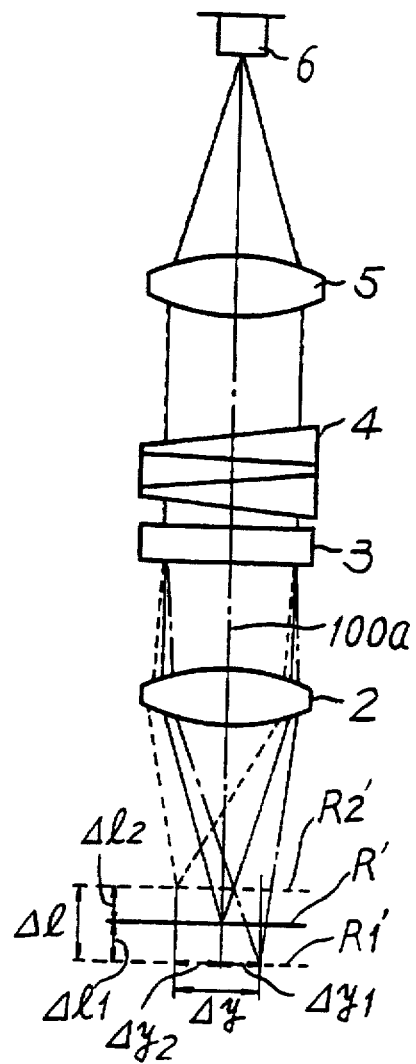
FIG. 2 is a schematic diagram showing the construction of the detection optical system in the alignment system of FIG. 1.

FIG. 2 shows the manner in which the chromatic aberrations shown in FIGS. 5 and 6 are produced at the conjugate plane R' and the manner in which the longitudinal chromatic aberration is compensated for by the projection lens 2 and the chromatic aberration of magnification is compensated for by the direct vision prism serving as the chromatic aberration of magnification compensating means in the detection optical system for detecting the wafer mark WM. Note that for purposes of simplification, the detection optical system for detecting the reticle mark RM and the illumination optical system for illuminating the reticle mark RM and the wafer mark WM are not shown.

In FIG. 2, the alignment optical system includes the objective lens 2 on the conjugate plane R' side (the projection lens 1 side) and the imaging lens 5 on the detector 6 side and the objective lens 2 is arranged in a manner that its front focal point coincides on the conjugate plane R' by the reference beam$\lambda_0$.

In other words, the alignment optical system is an afocal system, and arranged in the collimated light beam directed from the objective lens 2 to the imaging lens 5 are the cylindrical lens 3 and the direct vision prism 4 made by cementing three wedge prisms together to form the chromatic aberration of magnification compensating optical system 4. The cylindrical lens 3 has the purpose of attaining the coincidence between a meridional image and a sagittal δ image or the compensation of the astigmatism, and a parallel plane plate may be obliquely inserted in place of the cylindrical lens.

In FIG. 2, the light beam of the wavelength$\lambda_2$ is indicated by the broken lines, the light beam of the wavelength$\lambda_0$ is indicated by the solid lines and the light beam of the wavelength$\lambda_1$ is indicated by the dot-and-dash lines. As mentioned previously, the imaging position of the alignment mark by the projection lens 1 differs in dependence on the wavelength so that with the light beam of the wave-length $\lambda_0$ as a reference, the light beam of the wavelength$\lambda_2$ has the chromatic aberration amounts of $\Delta l_2$ and $\Delta y_2$ in the longitudinal and transverse directions, respectively, and the light beam of the wavelength$\lambda_1$, has the chromatic aberration amounts of $\Delta l_1$ and $\Delta y_1$ in the longitudinal and transverse directions, respectively.

While these longitudinal and transverse chromatic aberrations are respectively compensated for by the objective lens 2 and the compensating optical system 4, the compensation of the longitudinal and transverse chromatic aberrations will be described separately with reference to FIGS. 3 and 4, respectively, for purposes of simplification.

Figure 3:
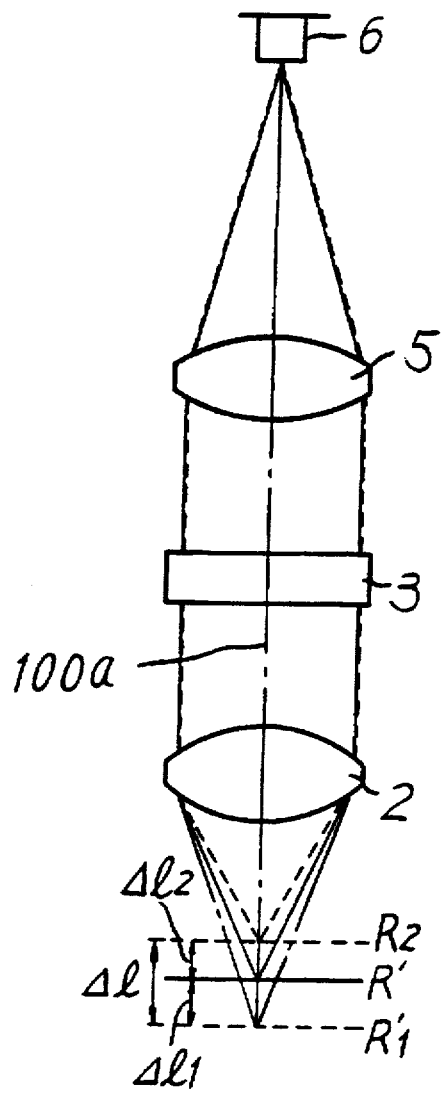
FIG. 3 is a schematic diagram showing the manner in which the longitudinal chromatic aberration caused by the projection lens is compensated for in the detection optical system of the alignment system.

In FIG. 3, the objective lens 2 has the function of reducing the imaging distance for incident light beams of high wavelengths and increasing the imaging distance for incident light beams of low wavelengths, and the longitudinal chromatic aberration is compensated for by the objective lens 2. In other words, the images of the wafer mark WM focused at different positions (R₂', R' and R₁') in the axial direction through the projection lens 1 are refocused on the photosensitive surface of the detector 6 through the objective lens 2, the cylindrical lens 3 and the imaging lens 5.

Figure 4:
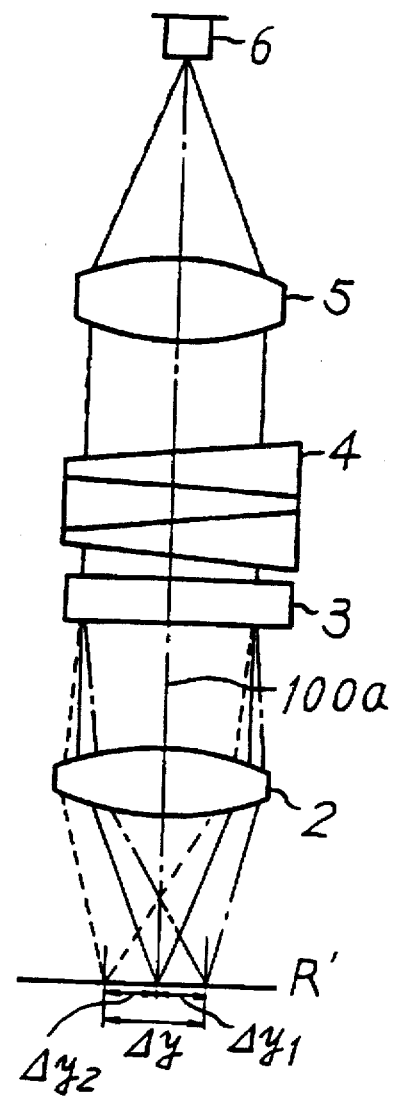
FIG. 4 is a schematic diagram showing the manner in which the lateral chromatic aberration caused by the projection lens is compensated for in the detection optical system of the alignment system.

Then, in FIG. 4 the direct vision prism 4 is composed of three wedge prisms having respectively low, high and low refraction indices and cemented in such a manner that their vertical angles are alternately arranged, and the direct vision prism 4 is arranged in such a manner that the refraction directions of the light beams of the respective wavelengths are extended parallel to the plane of the paper. As a result, the compensating direction of the lateral chromatic aberration (chromatic aberration of magnification) by the direct vision prism 4 becomes parallel to the plane of the paper (alignment direction).

As shown in FIG. 4, the image is shifted laterally on the imaging plane of the projection lens (the conjugate plane to the wafer W) and the chromatic aberrations ($\Delta y_2$, $\Delta y_1$) inwardly of the plane of the paper are compensated for by the direct vision prism 4. Therefore, the images of the alignment mark by the respective wavelengths coincide with the image by the reference wavelength $\lambda_0$ on the photosensitive surface of the detector 6.

In this way, the longitudinal and lateral chromatic aberrations are compensated for thereby producing a sharp image of the wafer mark WM on the photosensitive surface of the detector 6 as shown in FIG. 2.

Figure 7:
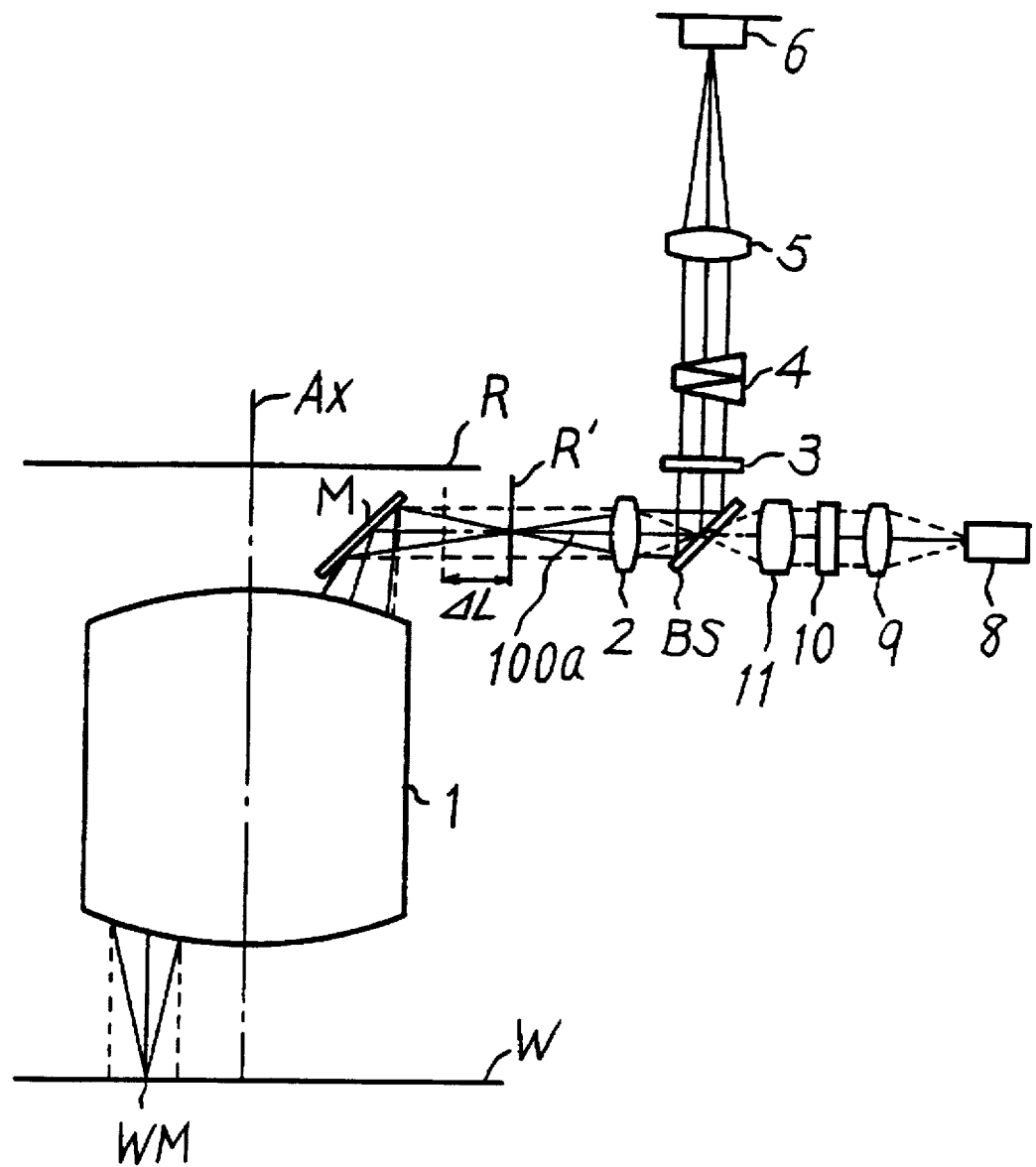
FIG. 7 is a schematic diagram showing the manner in which an alignment apparatus according to a second embodiment of the present invention is incorporated in the TTL alignment system of a projection exposure apparatus.

Next, the second embodiment of the present invention will be described with reference to FIG. 7. In the Figure, the components having the same functions as in the first embodiment are designated by the same reference numerals.

The present embodiment employs the alignment optical system of the TTL type and the direct vision prism 4 serving as the chromatic aberration of magnification compensating optical system is arranged within the afocal system between the objective lens 2 and the imaging lens 5.

The light beam emitted from the light source 8 (e.g., a white light source or multi-waveform laser) is first converted to a collimated light beam by the collimator lens 9 and then the waveform band is reduced by the filter 10 which passes only the light beam of a given waveform band.

Then, the alignment light of the reduced band is passed through the condensing lens 11 and the beam splitter BS and then converted to a collimated light beam by the objective lens 2. Thereafter, the light beam illuminates the wafer mark WM on the wafer W through a reflecting mirror M and the projecting lens 1.

Here, an illumination optical system is formed by the light source 8, the collimator lens 9, the filter 10, the condensing lens 11 and the objective lens 2.

Then, the reflected light from the wafer mark WM illuminated by the illumination optical system (in FIG. 7 the reference wavelength light beam is indicated by the solid lines) is focused through the projection lens 1 and the reflecting mirror M at a position apart by ΔL to the right from the conjugate plane which is equivalent to the reticle R with respect to the wafer W or a position R' shifted by an amount corresponding to the longitudinal chromatic aberration of the projection lens 1 as indicated by the broken lines.

Thereafter, the reflected light is converted to a collimated beam by the projection lens 1, reflected from the beam splitter BS and condensed by the imaging lens 5 through the cylinder lens 3 having a condensing function in a direction perpendicular to the plane of the paper for compensating the astigmatism and the direct vision prism 4 (chromatic aberration of magnification compensating optical system) for compensating the chromatic aberration of magnification, thereby forming a sharp image of the wafer mark WM on the detector 6 (e.g., a CCD detector or a television camera).

By virtue of this construction, the detector 6 is capable of detecting an accurate image of the wafer mark WM so that in accordance with the resulting detection signal, an alignment between the reticle and the wafer W relative to each other is accomplished.

Figure 8:
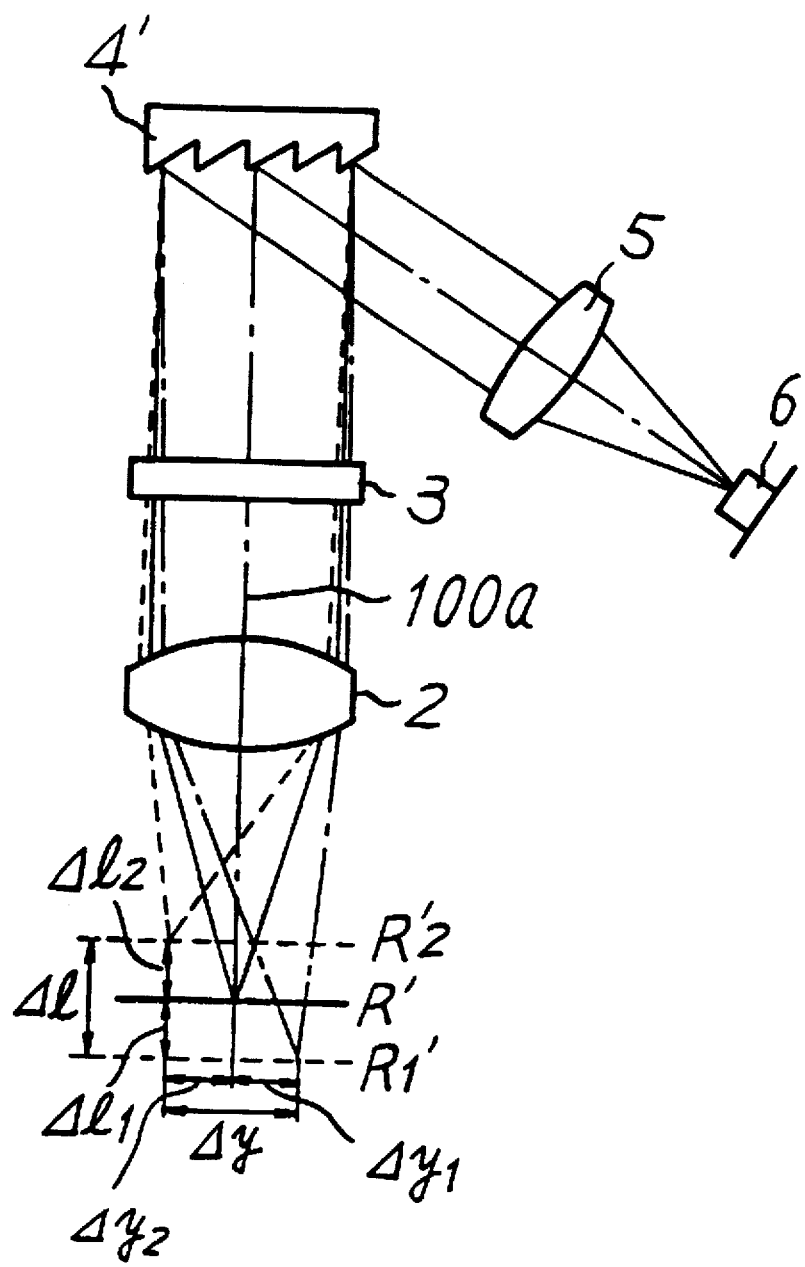
FIG. 8 is a schematic diagram showing the construction of the detection optical system of an alignment system according to a third embodiment of the present invention.

Referring now to FIG. 8, there is illustrated the third embodiment of the present invention and in the Figure its alignment optical system for detecting a wafer mark WM is shown as in the case of FIG. 2. In the Figure, the components having the same functions as in the first and second embodiments are designated by the same reference numerals. This embodiment differs from the first and second embodiments in that a reflection-type diffraction grating (blazed grating) 4' is used in place of the previously mentioned direct vision prism 4.

As shown in FIG. 8, when the wafer is illuminated with the illuminating light from the illumination optical system which is not shown, the light beams reflected from the wafer mark WM are passed through the projection lens which is not shown so that the longitudinal chromatic aberration and chromatic aberration of magnification are caused in the vicinity of the conjugate plane R' by the projection lens.

Then, the light beams of the respective wavelengths, which have been passed through the conjugate plane R', are first passed through the projection lens 2 thus compensating the longitudinal chromatic aberration and then the light beams are passed through the cylindrical lens 3 and through the diffraction grating 4' serving as the chromatic aberration of magnification compensating optical system, thereby compensating the chromatic aberration of magnification.

Therefore, the image of the wafer mark WM focused on the detector 6 by the imaging lens 5 is satisfactorily compensated for the chromatic aberrations and it is made more sharp. Thus, the detector 6 can detect this sharp image of the wafer mark WM and an alignment of greater accuracy can be accomplished in accordance with the resulting detection signal.

From the foregoing it will be seen that the compensation of the chromatic aberration of magnification can be effected by using as in the case of this embodiment the diffraction grating in place of the direct vision prism (the chromatic aberration of magnification compensating optical system) arranged within the TTR or TTL alignment optical system shown in the first embodiment or the second embodiment.

It is to be noted that the present invention is not limited to the reflection-type diffraction grating as shown in the present embodiment and the same effect can be obtained by means of a transmission-type diffraction grating.

While the above described embodiments have shown the cases in which the chromatic aberration of magnification is compensated for with the alignment optical system being in a stationary condition, the fourth embodiment shows an example of the compensation of chromatic aberration of magnification in a case where its alignment optical system is movable.

Figure 9:
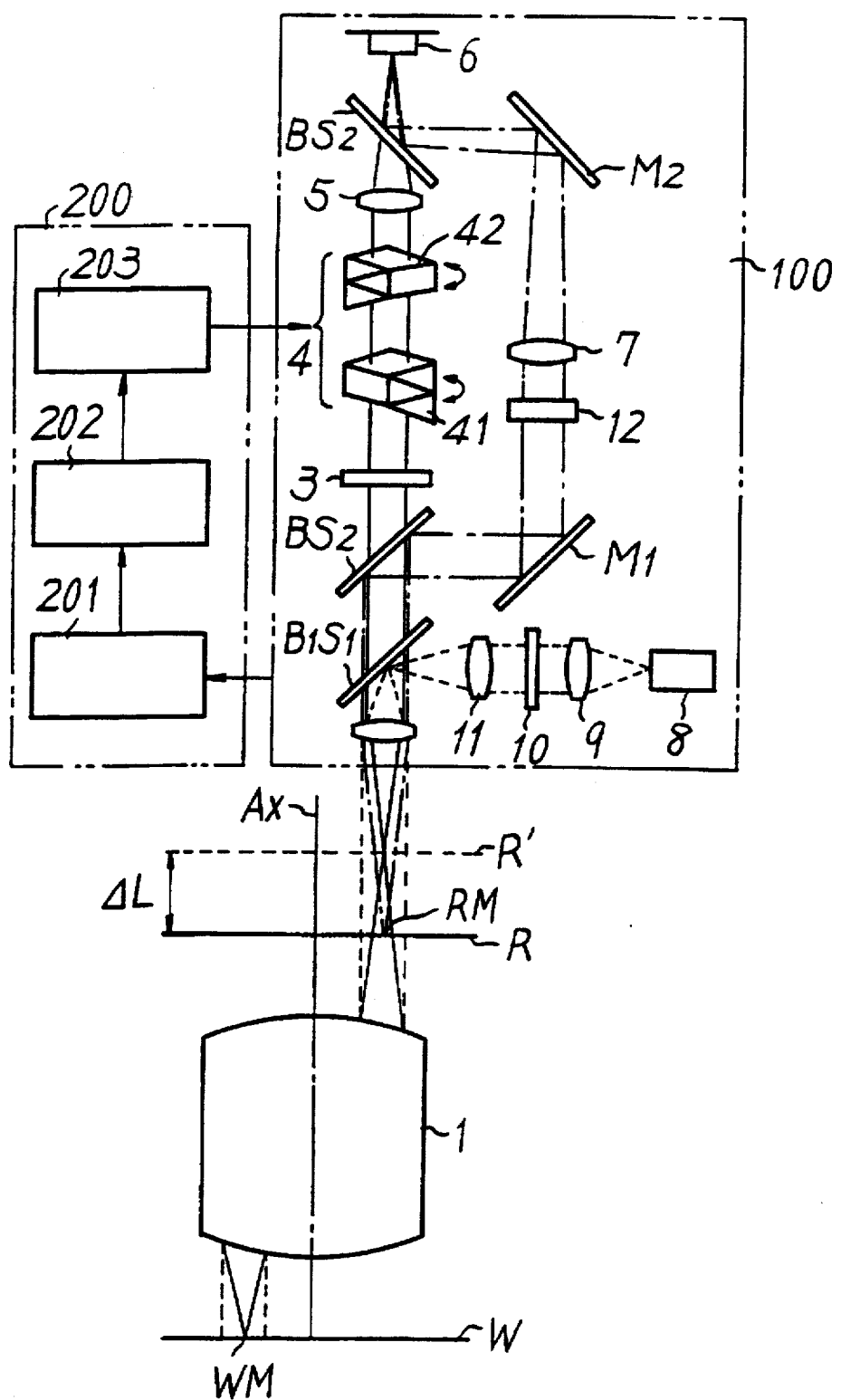
FIG. 9 is a schematic block diagram showing the manner in which an alignment apparatus according to a fourth embodiment of the present invention is incorporated and adapted to be movable in the TTR alignment system of a projection exposure apparatus.

As shown in FIG. 9, while this embodiment basically employs the TTR alignment optical system as in the case of the first embodiment of FIG. 1, two direct vision prisms 41 and 42 are arranged in tandem between the cylindrical lens 3 and the imaging lens 5.

These direct vision prisms 41 and 42 are arranged in such a manner that their chromatic aberration of magnification compensating directions are oppositely inclined mutually with respect to the plane of the paper. This condition is shown in the plan view of FIG. 10 in which the alignment direction (measuring direction) is the meridional direction of the projection lens 1 (in the direction of the plane of the paper in FIG. 9), and the two direct vision prisms are arranged in tandem with their compensating directions being rotated about the optical axis of the alignment optical system through the same angle in the opposite directions with respect to the alignment direction.

At this time, the angle θ formed by the compensating directions of the two direct vision prisms 41 and 42 (the angle θ is hereinafter referred to as a compensating angle) is set to a suitable angle in correspondence to the amount of chromatic aberration of magnification at the position of an alignment optical system 100, and this amount of chromatic aberration of magnification is varied in accordance with variation in the distance ΔY between the optical axis 100A of the alignment optical system and the optical axis Ax of the projection lens.

As a result, by increasing the compensating angle θ in accordance with the amount of chromatic aberration of magnification, the compensation effect on the chromatic aberration, of magnification can be reduced, whereas by decreasing the compensating angle θ, the compensating effect on the chromatic aberration of magnification can be increased.

Then, in order to detect the alignment mark provided at each of a plurality of locations on each of the wafer W and the reticle R or in order to effect the detection of the alignment marks when the reticle mark RM and the wafer mark WM are changed in position due to the polarization of the chip size to be exposed, the alignment optical system 100 is moved two-dimensionally over the reticle R.

Figure 10:
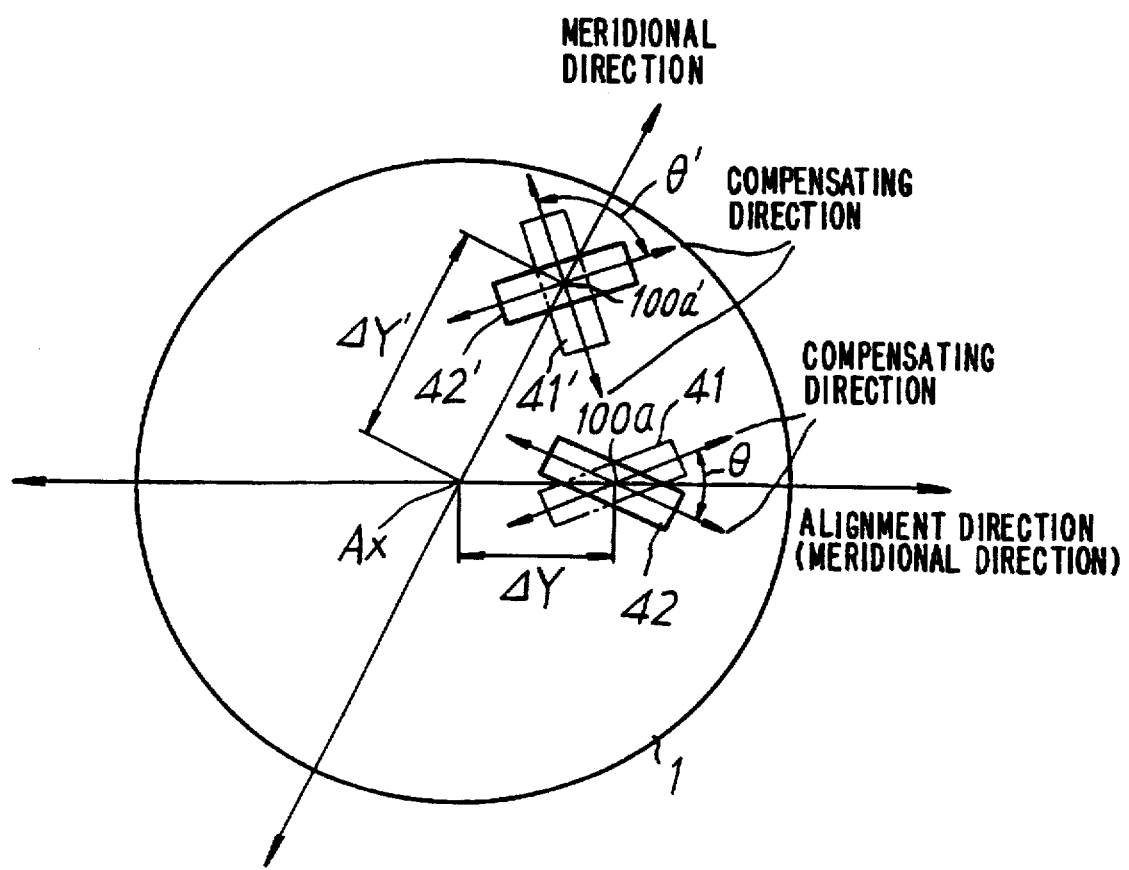

As shown in FIG. 10, if, for example, the alignment optical system 100 is moved two-dimensionally in such a manner that the optical axis of the alignment optical system 100 is changed from the position of 100a to the position of 100a', the direction and amount of occurrence of the chromatic aberration of magnification of the projection lens 1 are varied in response to this movement.

In this case, the compensation for the changes in the amount and direction of the chromatic aberration of magnification is accomplished by relatively rotating the two direct vision prisms (41', 42') in such a manner that while maintaining the condition in which the compensating directions of the direct vision prisms have the equal angle in the opposite directions to each other with respect to the meridional direction passing through the optical axis Ax of the projection lens 1 and the optical axis 100a' of the alignment optical system, a proper compensating angle θ' is attained which permits the compensation of the amount of the chromatic aberration of magnification in accordance with the distance ΔY between the optical axis Ax of the projection lens 1 and the optical axis 100a' of the alignment optical system 100.

In accordance with the present embodiment, the compensation of the direction and amount of occurrence of the chromatic aberration of magnification varying in response to the one-dimentional or two-dimensional movement of the alignment optical system 100 is automatically controlled by chromatic aberration of magnification variation compensating means 200.

Each time the alignment optical system 100 is moved, alignment optical system position detecting means 201 (e.g., an interferometer) detects the position of the alignment optical system 100 (e.g., the position ΔY of the optical axis 100a of the alignment optical system with respect to the optical axis Ax of the projection lens) and the resulting detected position signal is applied to chromatic aberration of magnification compensating amount computing means 202.

The chromatic aberration of magnification compensating amount computing means 202 includes a storage unit preliminarily storing the data of chromatic aberration of magnification amounts corresponding to the positions (ΔY) of the alignment optical system 100 and a computing unit for computing the amount and direction of compensation of the chromatic aberration of magnification amount corresponding to the position (ΔY) of the alignment optical system 100 (when the alignment optical system 100 is moved one-dimensionally, only the chromatic aberration of magnification compensating amount corresponding to the position of the alignment optical system 100 is computed).

Then, the chromatic aberration of magnification compensating amount computing means 202 computes the desired amount and direction of compensation (only the amount of compensation when the alignment optical system 100 is moved one-dimensionally) and this information is sent to driving means 203. In this way, the direction and amount of compensation for the chromatic aberration of magnification of the projection lens 1, which vary for every movement of the alignment optical system 100, are adjusted.

As a result, irrespective of the positions of the alignment marks (RM, WM) to be detected or the position of the alignment optical system 100, sharp images of the alignment marks (RM, WM) are always obtained and a relative alignment between the reticle R and the wafer W is attained with greater accuracy.

While, in this embodiment, the two same direct vision prisms 41 and 42 are arranged in tandem along the parallel light path (between the objective lens 2 and the imaging lens 5) to serve as the chromatic aberration of magnification compensating optical system 4, the same effect as the present embodiment can be accomplished by arranging two diffraction gratings in tandem along a parallel light path in such a manner that their compensating directions differ from each other and then rotating the gratings relatively.

Also, at this time, the diffraction gratings may be composed of two transmission-type diffraction gratings, two reflection-type diffraction gratings or two diffraction gratings of the transmission type and reflection type, respectively, so as to relatively rotate the two diffraction gratings to change the amount and direction of compensation of the chromatic aberration of magnification.

The fifth embodiment of the present invention will now be described briefly with reference to FIG. 16. This embodiment employs the TTR method and more specifically it is so designed that the chromatic aberration of magnification compensating optical system arranged within the detection optical system between the reticle R and the detector 6 shown in the first embodiment of the TTR type in FIG. 1, is arranged within the detection optical system between the reticle R and the projection objective lens to preliminarily compensate the chromatic aberrations (the chromatic aberration of magnification and the longitudinal chromatic aberration) to bring an image of the wafer mark WM into coincidence with the surface of the reticle R. Note that the components having the same functions as in the first embodiment are designated by the same reference numerals.

Figure 16:
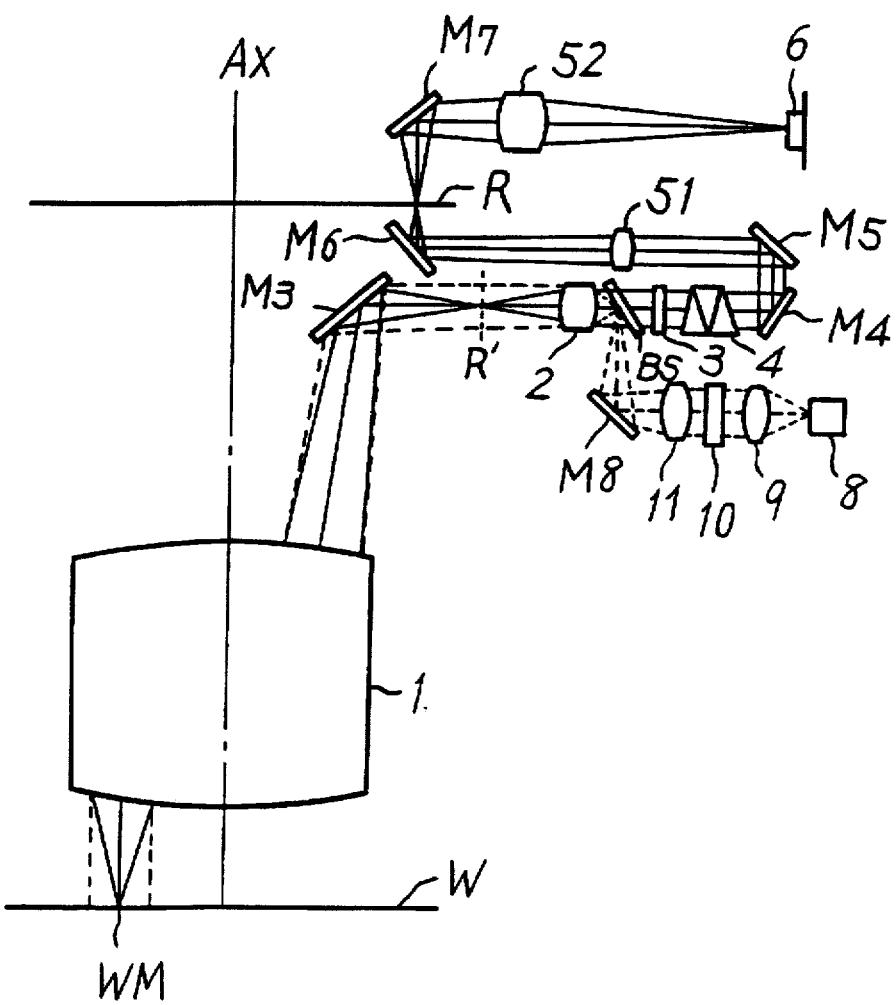
FIG. 16 is a schematic diagram showing the manner in which an alignment apparatus according to a fifth embodiment of the present invention is incorporated in the TTR alignment system of a projection exposure apparatus.

As shown by the broken lines in FIG. 16, the light beam having a given waveform band and emitted from the light source 1 illuminates uniformly the wafer mark WM through the collinator lens 9, the filter 10, the condensing lens 11, a reflecting mirror $M_8$, the beam splitter BS, the objective lens 2 and the projection lens 1.

Then, as shown by the solid lines, the reflected light from the wafer mark WM forms an image of the wafer mark WM on the reticle mark RM through the projection lens 1, a reflecting mirror $M_3$, the objective lens 2, the beam splitter BS, the cylinder lens 3 having a condensing function in a direction perpendicular to the plane of the paper for astigmatism compensating purposes, the direct vision prism (chromatic aberration of magnification compensating optical system) 4 made by cementing three wedge prisms together, reflecting mirrors $M_4$ and $M_5$, a condensing lens 51 and a reflecting mirror $M_6$.

Then, sharp images of the reticle mark RM and the wafer mark WM are formed on the detection surface of the detector 6 through a reflecting mirror $M_7$ and an imaging lens 52 so that a relative shift in position between the two images is detected to detect the relative positions of the reticle R and the wafer W.

It is to be noted that while, in the above-described embodiments, the chromatic aberration of magnification compensating optical system 4 comprises a prism or prisms (e.g., wedge prism, direct vision prism or prisms) or a diffraction grating, the present invention is not limited thereto and the same effect can be obtained by using for example refractive index distribution-type prisms whose refractive indices are varies in the optical axis direction.

Further, while the fourth embodiment shows the case in which the alignment optical system is movable arranged, it is needless to say that each of the other embodiments may be provided with a plurality of rotatable chromatic aberration of magnification compensating optical systems arranged in tandem in the optical axis direction and chromatic aberration of magnification variation compensating means so as to cope with the situation in which the alignment optical system is adapted to be movable.

What is claimed is:

1. An alignment apparatus for achieving an alignment between a first object and a second object when irradiating a projection light on the first object to project a pattern of the first object onto the second object through a projection optical system, said apparatus comprising:

an illumination optical system for illuminating a mark formed on said second object with a multiwavelength alignment light having a wavelength bandwidth different from that of said projection light;

a detection optical system for receiving a reflected light from said mark illuminated with said alignment light, through said projection optical system, to detect an image of said mark formed by said reflected light; and a compensating optical system arranged within said detection optical system to provide compensation for a chromatic aberration of magnification caused by said projection optical system due to wavelength differences among a plurality of wavelength components within the wavelength bandwidth of said alignment light, wherein said illumination optical system and said detection optical system are movable as a unit relative to said projection optical system, wherein said compensating optical system includes a first compensating optical member and a second compensating optical member, wherein at least one of said first and second compensating optical members is rotatable about an optical axis of said detection optical system, and wherein the amount and direction of occurrence of said chromatic aberration of magnification varied as the result of the unitary movement of said illumination optical system and said detection optical system relative to said projection optical system are compensated for by rotating said first and second compensating optical members relative to each other.

2. The alignment apparatus according to claim 1, wherein said detection optical system includes an objective lens and an imaging lens so as to convert said reflected light from said mark into a substantially collimated light beam, passing from said objective lens to said imaging lens, and wherein said compensating optical system is arranged between said objective lens and said imaging lens.

3. The alignment apparatus according to claim 2, wherein said compensating optical system comprises an optical dispersion member.

4. The alignment apparatus according to claim 1, wherein said first compensating optical member and said second compensating optical member comprises a direct vision prism.

5. An exposure apparatus including exposure light supply means for supplying an exposure light to a first object, a projection optical system for projecting a pattern of said first object onto a second object using said exposure light, and an alignment system for achieving an alignment between said first and second objects, the improvement wherein said alignment system comprises:

an illumination optical system for illuminating an alignment mark formed on said second object with an alignment light including a plurality of wavelength components different in wavelength from that of said projection light;

a detection optical system for receiving a reflected light from said alignment mark illuminated with said alignment light, through said projection optical system, to detect an image of said alignment mark formed by said reflected light; and a compensating optical system for compensating a chromatic aberration of magnification caused by said projection optical system due to the differences in wavelength among said wavelength components of said alignment light, wherein said compensating optical system includes a first compensating optical member and a second compensating optical member, wherein at least one of said first and second compensating optical members is rotatable about an optical axis of said detection optical system, and wherein the amount and direction of compensation of said chromatic aberration of magnification are varied in response to relative rotation of said first and second compensating optical members.

6. The exposure apparatus according to claim 5, wherein said alignment system is movable as a unit relative to said projection optical system, wherein said compensating optical system includes a first compensating optical member and a second compensating optical member, wherein at least one of said first and second compensating optical members is rotatable about an optical axis of said detection optical system, and wherein the amount and direction of occurrence of said chromatic aberration of magnification varying as the result of the relative movement of said alignment system and said projection optical system are compensated for in response to relative rotation of said first and second compensating optical members.

7. The exposure apparatus according to claim 6, further comprising compensating means for compensating the amount and direction of said chromatic aberration of magnification varying in response to the movement of said alignment system, wherein said compensating means includes first means for detecting a position of said alignment system, second means responsive to an output from said first means to compute an amount of said chromatic aberration of magnification and a direction of compensation of said chromatic aberration of magnification, and third means for driving relative rotation of said first and second compensating optical members in response to an output from said second means.

8. The exposure apparatus according to claim 6, wherein each of said first compensating optical member and said second compensating optical member comprises an optical dispersion member.

9. The exposure apparatus according to claim 5, wherein said detection optical system includes an objective lens and an imaging lens so as to convert said reflected light from said alignment mark into a substantially collimated light beam passing from said objective lens to said imaging lens, and wherein said compensating optical system is arranged between said objective lens and said imaging lens.

10. An exposure apparatus including exposure light supply means for supplying an exposure light to a first object, a projection optical system for projecting a pattern of said first object onto a second object using said exposure light, and an alignment system for achieving an alignment between said first and second objects, the improvement wherein said alignment system comprises:

an illumination optical system for illuminating an alignment mark formed on said second object with an alignment light including a plurality of wavelength components different in wavelength from that of said projection light;

a detection optical system for receiving a reflected light from said alignment mark illuminated with said alignment light, through said projection optical system, to detect an image of said alignment mark formed by said reflected light; and a compensating optical system for compensating a chromatic aberration of magnification caused by said projection optical system due to the differences in wavelength among said wavelength components of said alignment light, wherein said compensating optical system includes a first compensating optical member and a second compensating optical member, and wherein at least one of said first and second compensating optical members is rotatable about an optical axis of said detection optical system so as to vary the amount of compensation of said chromatic aberration of magnification in response to relative rotation of said first and second compensating optical members.

11. The exposure apparatus according to claim 10, further comprising compensating means for compensating the amount of said chromatic aberration of magnification varying in response to the movement of said alignment system, wherein said compensating means includes first means for detecting a position of said alignment system, second means responsive to an output from said first means to compute an amount of chromatic aberration of magnification, and third means for driving relative rotation of said first and second compensating optical members in response to an output from said second means.

12. An alignment apparatus for achieving an alignment between a first object and a second object when irradiating a projection light on said first object to project a pattern of said first object onto said second object through a projection optical system, said apparatus comprising:

an illumination optical system for illuminating a mark formed on said second object with a multiwavelength alignment light having a predetermined wavelength bandwidth different from that of said projection light;

a detection optical system for receiving a reflected light from said mark illuminated with said alignment light, through said projection optical system, to detect an image of said mark formed by said reflected light;

said detection optical system including an objective lens and an imaging lens so as to convert said reflected light from said mark into a substantially collimated light beam passing from said objective lens to said imaging lens; and a compensating optical system arranged between said objective lens and said imaging lens for compensating a chromatic aberration of magnification caused by said projection optical system due to wavelength differences among a plurality of wavelength components within the wavelength bandwidth of said alignment light, wherein said compensating optical system comprises a first compensating optical member and a second compensating optical member, and wherein at least one of said first and second compensating optical members is rotatable about an optical axis of said detection optical system so as to vary the amount and direction of compensation of said chromatic aberration of magnification in response to relative rotation of said first and second compensating optical members.

13. The alignment apparatus according to claim 12, wherein said compensating optical system comprises optical dispersion member.

14. The alignment apparatus according to claim 12, wherein said compensating optical system comprises a diffraction grating.

15. The alignment apparatus according to claim 12, wherein said compensating optical system comprises a direct vision prism.

16. In an exposure apparatus including an alignment system for detecting relative positions of a first object and a second object when transferring a pattern of said first object onto said second object through a projection optical system, the improvement wherein said alignment system comprises:

an illumination optical system for illuminating an alignment mark formed on said second object with an alignment light including a plurality of wavelength components;

a detection optical system for detecting said alignment mark on said second object through said projection optical system; and a compensating optical system for compensating a chromatic aberration of magnification caused by said projection optical system due to differences in wavelength among said wavelength components of said alignment light when said alignment mark on said second object is detected by said detecting optical system through said projection optical system, wherein said compensating optical system includes a first compensating optical member and a second compensating optical member, and wherein at least one of said first and second compensating optical members is rotatable about an optical axis of said detection optical system so as to vary the amount of compensation of said chromatic aberration of magnification in response to relative rotation of said first and second compensation optical members.

17. An alignment apparatus for achieving an alignment between a first object and a second object when irradiating a projection light on the first object to project a pattern of the first object onto the second object through a projection optical system, said apparatus comprising: an illumination optical system for illuminating a mark formed on said second object with a multiwavelength alignment light having a wavelength bandwidth different from that of said projection light; a detection optical system for receiving a reflected light from said mark illuminated with said alignment light, through said projection optical system, to detect an image of said mark formed by said reflected light; and a compensating optical system arranged within said detection optical system to provide compensation for a chromatic aberration of magnification caused by said projection optical system due to wavelength differences among a plurality of wavelength components within the wavelength bandwidth of said alignment light, wherein said illumination optical system and said detection optical system are movable as a unit relative to said projection optical system, wherein said compensating optical system includes a compensating optical member which is rotatable about an optical axis of said detection optical system, and wherein the amount of occurrence of said chromatic aberration of magnification varied as the result of the unitary movement of said illumination optical system and said detection optical system relative to said projection optical system is compensated for by rotating said compensating optical member.

18. The alignment apparatus according to claim 17, wherein said detection optical system includes an objective lens and an imaging lens so as to convert said reflected light from said mark into a substantially collimated light beam passing from said objective lens to said imaging lens, and wherein said compensating optical system is arranged between said objective lens and said imaging lens.

19. The alignment apparatus according to claim 18, wherein said compensating optical member comprises an optical dispersion member.

20. The alignment apparatus according to claim 17, wherein said compensating optical member comprises a direct vision prism.

21. An exposure apparatus including exposure light supply means for supplying an exposure light to a first object, a projection optical system for projecting a pattern of said first object onto a second object using said exposure light, and an alignment system for achieving an alignment between said first and second objects, the improvement wherein said alignment system comprises: an illumination optical system for illuminating an alignment mark formed on said second object with an alignment light including a plurality of wavelength components different in wavelength from that of said projection light; a detection optical system for receiving a reflected light from said alignment mark illuminated with said alignment light, through said projection optical system, to detect an image of said alignment mark formed by said reflected light; and a compensating optical system for compensating a chromatic aberration of magnification caused by said projection optical system due to the differences in wavelength among said wavelength components of said alignment light, is rotatable about an optical axis of said detection optical system, and wherein the amount of compensation of said chromatic aberration of magnification is varied in response to rotation of said compensating optical member.

22. The exposure apparatus according to claim 21, wherein said alignment system is movable as a unit relative to said projection optical system, and wherein the amount of occurrence of said chromatic aberration of magnification varying as the result of the relative movement of said alignment system and said projection optical system is compensated for in response to rotation of said compensating optical member.

23. The exposure apparatus according to claim 22, further comprising compensating means for compensating the amount of said chromatic aberration of magnification varying in response to the movement of said alignment system, wherein said compensating means includes first means for detecting a position of said alignment system, second means responsive to an output from said first means to compute an amount of said chromatic aberration of magnification, and third means for driving rotation of said compensating optical member in response to an output from said second means.

24. An exposure apparatus including exposure light supply means for supplying an exposure light to a first object, a projection optical system for projecting a pattern of said first object onto a second object using said exposure light, and an alignment system for achieving an alignment between said first and second objects, the improvement wherein said alignment system comprises: an illumination optical system for illuminating an alignment mark formed on said second object with an alignment light including a plurality of wavelength components different in wavelength from that of said projection light; a detection optical system for receiving a reflected light from said alignment mark illuminated with said alignment light, through said projection optical system, to detect an image of said alignment mark formed by said reflected light; and a compensating optical system for compensating a chromatic aberration of magnification caused by said projection optical system due to the differences in wavelength among said wavelength components of said alignment light, wherein said compensating optical system includes a compensating optical member, and wherein said compensating optical member is rotatable about an optical axis of said detection optical system so as to vary the amount of compensation of said chromatic aberration of magnification in response to rotation of said compensating optical member.

25. The exposure apparatus according to claim 24, further comprising compensating means for compensating the amount of said chromatic aberration of magnification varying in response to the movement of said alignment system, wherein said compensating means includes first means for detecting a position of said alignment system, second means responsive to an output from said first means to compute an amount of chromatic aberration of magnification, and third means for driving relative rotation of said compensating optical member in response to an output from said second means.

26. The exposure apparatus according to claim 24, wherein said detection optical system includes an objective lens and an imaging lens so as to convert said reflected light from said alignment mark into a substantially collimated light beam passing from said objective lens to said imaging lens, and wherein said compensating optical system is arranged between said objective lens and said imaging lens.

27. The exposure apparatus according to claim 26, wherein said compensating optical member comprises an optical dispersion member.

28. An alignment apparatus for achieving an alignment between a first object and a second object when irradiating a projection light on said first object to project a pattern of said first object onto said second object through a projection optical system, said apparatus comprising: an illumination optical system for illuminating a mark formed on said second object with a multiwavelength alignment light having a predetermined wavelength bandwidth different from that of said projection light; a detection optical system for receiving a reflected light from said mark illuminated with said alignment light, through said projection optical system, to detect an image of said mark formed by said reflected light; said detection optical system including an objective lens and an imaging lens so as to convert said reflected light from said mark into a substantially collimated light beam passing from said objective lens to said imaging lens; and a compensating optical system arranged between said objective lens and said imaging lens for compensating a chromatic aberration of magnification caused by said projection optical system due to wavelength differences among a plurality of wavelength components within the wavelength bandwidth of said alignment light, wherein said compensating optical system comprises a compensating optical member, and wherein said compensating optical member is rotatable about an optical axis of said detection optical system so as to vary the amount of compensation of said chromatic aberration of magnification in response to rotation of said compensating optical member.

29. The alignment apparatus according to claim 28, wherein said compensating optical member comprises an optical dispersion member.

30. The alignment apparatus according to claim 28, wherein said compensating optical member comprises a diffraction grating.

31. The alignment apparatus according to claim 28, wherein said compensating optical member comprises a direct vision prism.

32. In an exposure apparatus including an alignment system for detecting relative positions of a first object and a second object when transferring a pattern of said first object onto said second object through a projection optical system, the improvement wherein said alignment system comprises: an illumination optical system for illuminating an alignment mark formed on said second object with an alignment light including a plurality of wavelength components; a detection optical system for detecting said alignment mark on said second object through said projection optical system; and a compensating optical system for compensating a chromatic aberration of magnification caused by said projection optical system due to differences in wavelength among said wavelength components of said alignment light when said alignment mark on said second object is detected by said detecting optical system through said projection optical system, wherein said compensating optical system includes a compensating optical member, and wherein said compensating optical member is rotatable about an optical axis of said detection optical system so as to vary the amount of compensation of said chromatic aberration of magnification in response to rotation of said compensating optical member.

* * * * *